(12) United States Patent
Marten

(10) Patent No.: US 8,289,030 B2
(45) Date of Patent: Oct. 16, 2012

(54) RELIABLE SIGNALING OF FAULT CONDITIONS IN BATTERY SYSTEMS WITH SERIES-CONNECTED CELLS

(75) Inventor: Victor Marten, Flushing, NY (US)

(73) Assignee: Sendyne Corporation, New York, NY (US)

(*) Notice: Subject to any disclaimer, the term of this patent is extended or adjusted under 35 U.S.C. 154(b) by 0 days.

(21) Appl. No.: 13/263,713

(22) PCT Filed: Feb. 17, 2011

(86) PCT No.: PCT/IB2011/050654
§ 371 (c)(1),
(2), (4) Date: Jan. 10, 2012

(87) PCT Pub. No.: WO2012/049572
PCT Pub. Date: Apr. 19, 2012

(65) Prior Publication Data
US 2012/0176706 A1   Jul. 12, 2012

Related U.S. Application Data

(60) Provisional application No. 61/393,249, filed on Oct. 14, 2010.

(51) Int. Cl.
*G01R 31/02* (2006.01)

(52) U.S. Cl. .................. 324/537; 324/547; 324/762.08; 324/762.09

(58) Field of Classification Search .................. 324/537, 324/547, 762.08, 762.09
See application file for complete search history.

(56) References Cited

U.S. PATENT DOCUMENTS

| | | | |
|---|---|---|---|
| 5,773,962 A | 6/1998 | Nor | |
| 6,987,390 B2* | 1/2006 | Suss et al. ................. | 324/547 |
| 7,046,157 B2* | 5/2006 | Graube ..................... | 340/650 |
| 7,475,264 B2* | 1/2009 | Bell ......................... | 713/300 |
| 2003/0022040 A1 | 1/2003 | Wells | |
| 2008/0143543 A1 | 6/2008 | Vandensande et al. | |
| 2009/0009178 A1 | 1/2009 | Okamoto et al. | |

OTHER PUBLICATIONS

International Search Report dated Sep. 27, 2011 from ISA—KR.
Written Opinion of the International Search Authority dated Sep. 27, 2011 from ISA—KR.

* cited by examiner

*Primary Examiner* — Rexford Barnie
*Assistant Examiner* — Tien Mai
(74) *Attorney, Agent, or Firm* — Oppedahl Patent Law Firm LLC

(57) ABSTRACT

A system is used with a plurality of modules, each module requiring galvanic isolation from the other modules. Galvanic isolators are employed, each having an input and an output, the output galvanically isolated from the input, the output responsive to the input according to a response characteristic of the isolator. Each module has, a respective first isolator and a respective second isolator. The input of each respective first isolator and each respective second isolator for each module is disposed controllably to receive an activation signal from the module indicative of a module fault to be annunciated or to receive a test signal from the module, the test signal being smaller than the activation signal. The outputs of the respective first isolators are aggregated to a first node and the outputs of the respective second isolators are aggregated to a second node. A selection circuit selects from the first node and the second node, yielding a fault signal output when the selected node satisfies a predetermined condition. An analog-to-digital converter is coupled with each of the nodes, the analog-to-digital converter disposed to sense an output from one of the isolators indicative of its response characteristic in the event of a test signal being applied to the isolator.

12 Claims, 5 Drawing Sheets

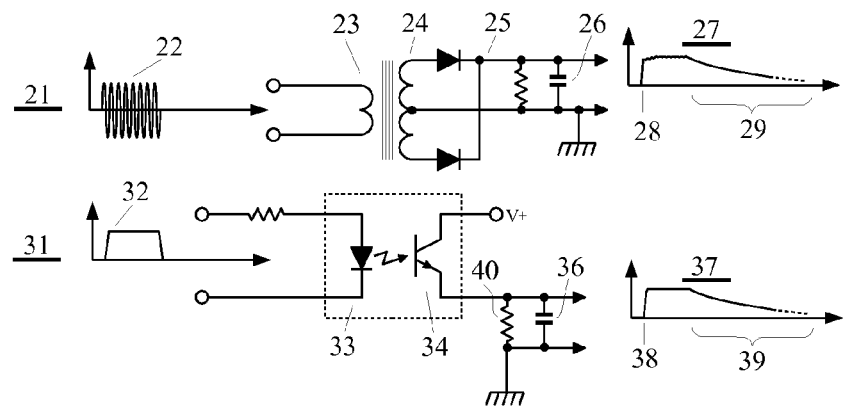
Figure 1.  Prior art, galvanic signal isolators
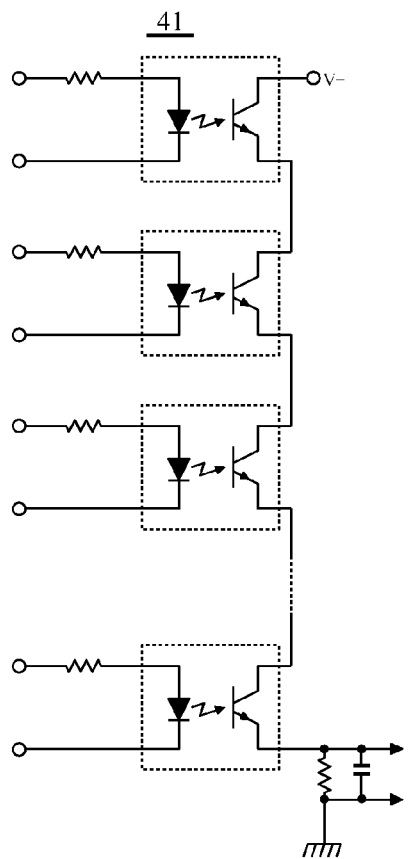
Figure 2.  Prior art, wired AND.
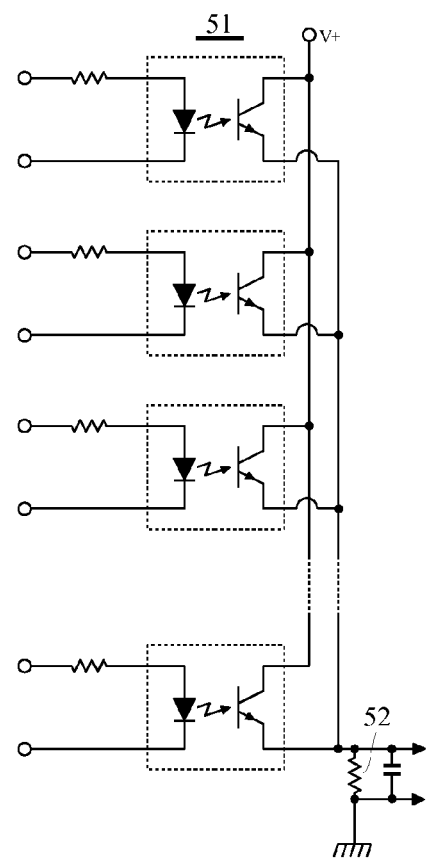
Figure 3.  Prior art, wired OR.

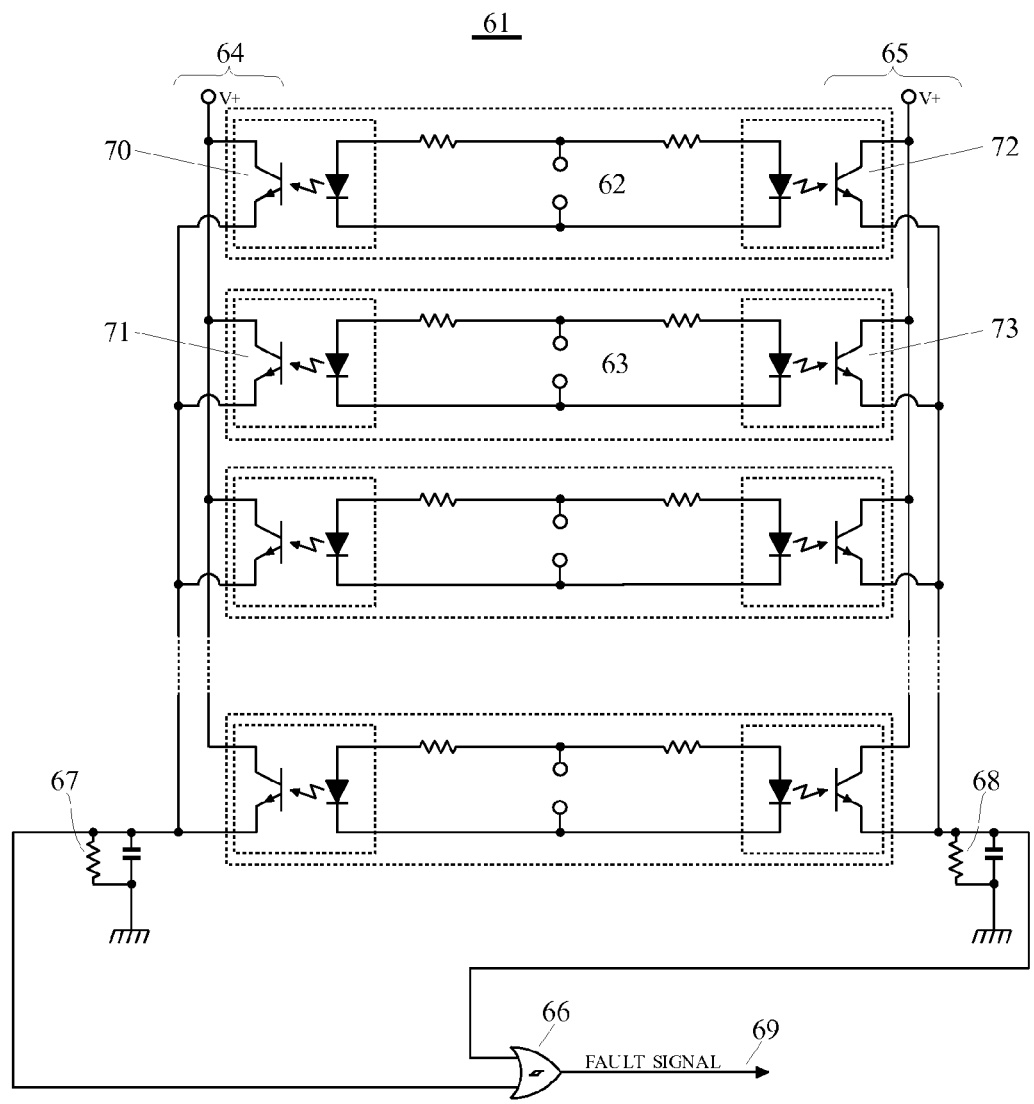
Figure 4.   Prior art, wired OR with two redundant channels.

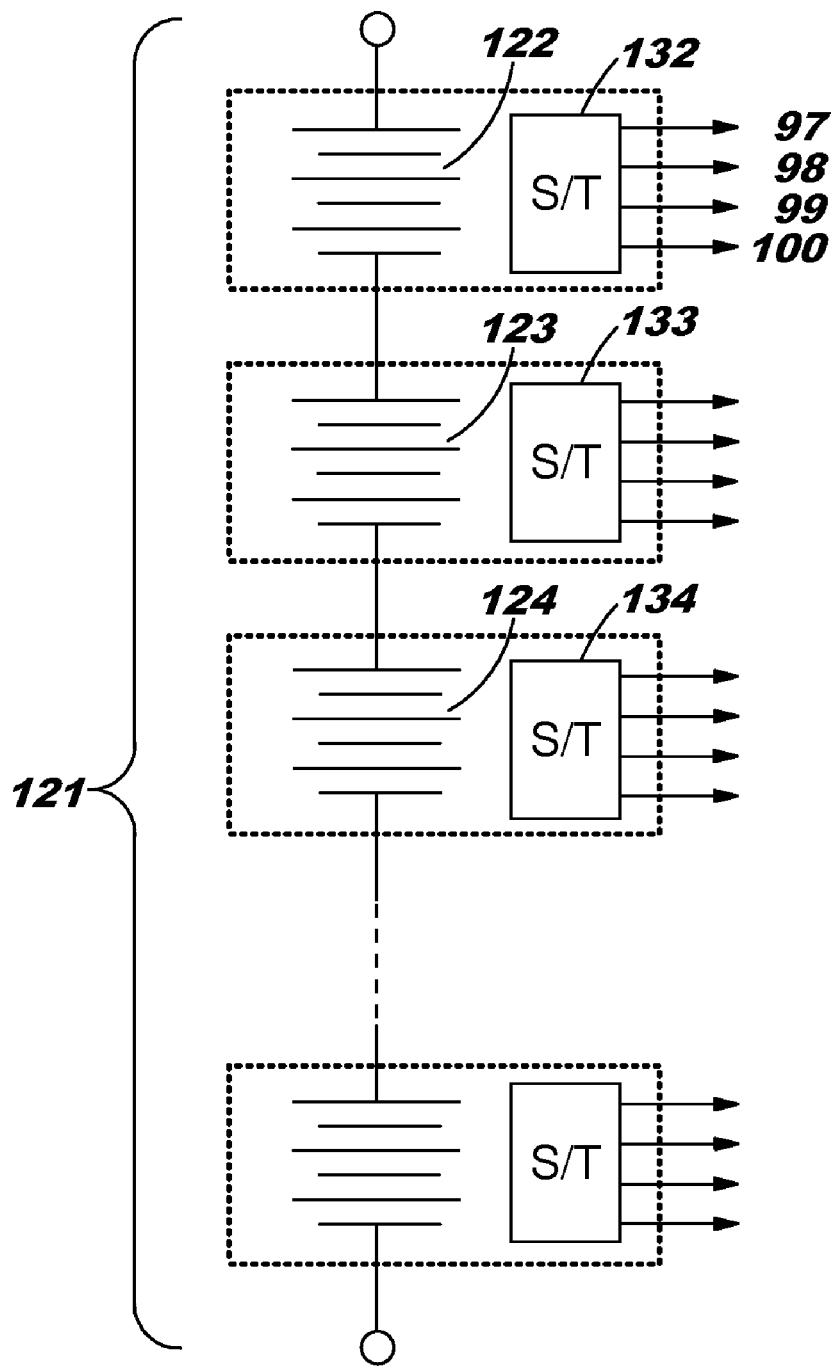

US 8,289,030 B2

RELIABLE SIGNALING OF FAULT CONDITIONS IN BATTERY SYSTEMS WITH SERIES-CONNECTED CELLS

CROSS REFERENCE TO RELATED APPLICATIONS

This application claims the benefit of U.S. provisional application No. 61/393,249 filed Oct. 14, 2010, which is hereby incorporated by reference for all purposes.

BACKGROUND

In any control system it is often desired to have an emergency deactivating signal that prevents system deterioration, possible destruction and bodily harm to the users. Obviously, propagation of such a fault signal should be highly reliable and available at all times, even after long periods of inactivity (or, possibly, when the fault signal has never been activated before it is required).

The fault signal can be used by the overall system controller that is able to act in order to prevent harmful consequences; the actions may include disconnection of the load, immediate cessation of charging of the batteries, or other actions.

It is also desirable for this fault signal to act quickly.

At the same time, it is desirable that the circuits relating to fault signals consume as little energy as possible, especially in the inactive or quiescent state.

Moreover, it is desirable that a system consisting of many individual modules provides an ability for any one module to bring about the common emergency signal.

It is not easy to accomplish simultaneously each of the design goals just mentioned. But however difficult such an accomplishment might be as a general matter, it is particularly difficult when the modules being monitored are at different voltage potentials from each other. When modules being monitored are at differing voltage potentials, then the monitoring circuits are required to be galvanically isolated from each other. One example of a real-life situation where modules being monitored are at differing voltage potentials is the case of a large battery constructed from a series string of modules, in which each module is itself constructed from series-connected cells.

For a fuller appreciation of the invention it will be helpful to review briefly some of the prior art.

Two galvanic isolation circuits 21 and 31 are shown in FIG. 1.

Circuit 21 relies upon a transformer 23, 24. A time-varying signal 22 such as an AC current arrives at primary winding 23. Induced current at secondary winding 24 is rectified at 25 and smoothed by capacitance 26. Importantly the transformer windings are galvanically isolated from each other, so the input and output of circuit 21 have no common voltage reference. Time plot 27 models the output which rises quickly at 28 and which decays more slowly at 29, in part because the circuitry receiving the output of circuit 21 (which circuitry is omitted for clarity in FIG. 1) is likely of relatively high impedance.

Circuit 31 uses an optical isolator 33, 34. A current 32 such as a step function current arrives at light-emitting diode (LED) 33. Some of the resulting emitted light impinges upon phototransistor 34, turning on the transistor 34. The transistor 34 defines a voltage divider with resistor 40, giving rise to an output voltage for circuit 31. Importantly the LED and phototransistor are galvanically isolated from each other, so the input and output of circuit 31 have no common voltage reference. Time plot 37 models the output which rises quickly at 38 and which decays more slowly at 39, in part because the circuitry receiving the output of circuit 31 (which circuitry is omitted for clarity in FIG. 1) is likely of relatively high impedance.

It is typical that such circuits have a relatively fast turn-on, while turn-off is somewhat slow. Therefore, it is advantageous to utilize the fast-acting turn-on operation for indication of an emergency or fault-annunciation signal, rather than using the slower turn-off operation as indication of the emergency or fault-annunciation signal.

Investigators have proposed and have attempted to develop galvanically isolated signal couplers that make use of capacitive coupling. Other investigators have proposed galvanically isolated couplers comprised of spin valves which are based upon the phenomenon of GMR (giant magnetoresistance).

It is easy enough, using any of several kinds of galvanically isolated signal couplers, to devise approaches for collecting fault signals from modules that are at differing electrical potentials, for combining the fault signals, and for passing the combined fault signal to appropriate devices. One of the challenges comes, however, when one sets a more demanding goal of devising an approach which works reliably even in the face of one or more component failures or degradations.

Some component failure modes are easy to imagine and easy to model. Returning to circuit 31 of FIG. 1, imagine an open circuit at LED 33 or at phototransistor 34. Alternatively imagine some circuit fault that causes LED 33 to be constantly lit despite the presence of some fault condition "upstream" of LED 33. Or imagine a metallic short at or nearby to the transistor 34.

Other component failures are more subtle to describe and to model. An optoisolator such as the LED-phototransistor 33, 34 of FIG. 1 defines what is called a current transfer ratio ("CTR") namely the ratio of output current (passing through transistor 34) to input current (passing through LED 33). The CTR is partly a function of the condition of the optical path providing optical coupling between the LED and phototransistor; the optical path has at least two interfaces each defined by distinct optical media, and each interface can change in its physical condition and properties over time. The CTR is also a function of the beta of the transistor, which also can change over time.

The other galvanic isolating coupler technologies just mentioned each have some analogous transfer ratio for a given implementation, and to the extent that the transfer ratio presents a risk of change over time, then this also counts as a category of component failure which the system designer would wish to be able to describe and to model. And, to state the obvious, the system designer will wish that an approach could be found that would permit high reliability even in the face of the various component failure modes.

FIG. 2 shows one approach for combining fault signals from any of several modules. In circuit 41 of FIG. 2, the phototransistors are placed in series. This may be termed a "wired AND" in which the phototransistors are "on" nearly all of the time, because the LEDs are lit nearly all of the time. Any one module signals a fault condition by turning its LED off, which turns off the associated phototransistor. The output of circuit 41, formerly pulled high by the "on" phototransistors, drops to a low level and this annunciates the detection of a failure.

With circuit 41, one particular failure mode, namely an open-circuit failure, will count as an annunciation. It will be a "false positive" but at least it will not risk later giving rise to a "false negative" during some actual detected fault.

Circuit 41 does not, however, deal with the risk of a closed-circuit failure. Thus for example if there were some circuit fault that causes LED 33 to be constantly lit despite the presence of some fault condition "upstream" of LED 33, then that fault would never get annunciated. Likewise if there were a metallic short at or nearby to the transistor 34, then upstream faults would not get annunciated.

Still another drawback to circuit 41 is that all of the opto-isolators must be activated all the time, thus consuming significant energy continuously. The alert reader will also note that the "active" state of the signal (the annunciation of a fault) is generated by the slow-acting turn-off action of the opto-isolator, mentioned above in connection with decay waveform 39 in FIG. 1.

The natural next step, having considered the wired-AND arrangement of circuit 41 (FIG. 2), is to consider a wired-OR arrangement. Such a circuit 51 is depicted in FIG. 3, where individual signals from every separate module are connected in "parallel" to each other, in a so-called wired-OR fashion. If any one opto-isolator is activated, then the output signal is activated.

It will be appreciated, however, that with circuit 51, one of the very common failure modes for an opto-isolator, namely the above-mentioned "open-circuit" failure, can lead to the circuit 51 being blind to a fault condition at one of the monitored modules.

More subtly, consider the consequences of a degradation (reduction) of the CTR of any one of the opto-isolators. Recall that each transistor in circuit 51 is obligated to bring about a voltage-divider result relative to the resistor 52. But nothing in circuit 51 provides for or guards against a gradual degradation of the CTR of any one of the opto-isolators of the circuit 51. Such degradation could lead to the circuit 51 being blind to a fault condition at one of the monitored modules.

For these reasons, the circuit in FIG. 3 is not suitable to highly reliable signal propagation.

FIG. 4 shows a variant 61 of the circuit of FIG. 3, having redundant signal paths. A detected fault, annunciated by an LED stimulation current at 62, turns on both transistors 70, 72, either of which brings about a trigger of OR gate 66, giving rise to failure annunciation output 69. This circuit 61, for all of its complexity and larger component count, fails nonetheless at its reliability goals, as will now be discussed.

If one were to define "reliability" as "surviving one circuit fault", then circuit 61 would count as "reliable", since either communications path (toward transistor 70 or toward transistor 72) could fail and yet the fault signaled at 62 would propagate to line 69.

But circuit 61, having survived one circuit fault, is henceforth no more reliable than the previously mentioned circuit 51 (FIG. 3) and will eventually fail at its purpose when some subsequent circuit fault happens.

A more robust definition of "reliabililty" in this context includes some notion of detecting a circuit fault so that a module can be replaced (remedying that circuit fault), ideally before some second circuit fault would be likely to have happened. Ideally the circuit continues to serve its overall purpose despite that circuit fault having occurred, so that even during the (non-zero) time interval that passes between detecting that circuit fault and remedying that circuit fault, the aggregation of fault reports can be carried out without interruption.

Put plainly, the approach of circuit 61 (FIG. 4) will overcome a single fault, but not two or more faults.

It will be helpful to develop some terminology to be employed in the present discussion. By "failure" or "fault" we may mean either of two things:

a detected condition within one module of a multi-module system, the condition being intended to trigger some corrective action such as disconnecting a charging current or disconnecting a load; or a complete failure or a performance degradation as to some circuit component or circuit element in the failure monitoring system, detection of which may prompt replacement of a failed or degraded component in that monitoring system.

The former may be referred to as "a module failure" or "a fault signal" and the latter may be referred to as "a circuit failure".

It would be desirable if an approach could be devised which would permit propagation of fault signals from each of several modules, each at a different voltage potential from the others, the propagation of the signals being fast, the signals being logically combined so that the fault signal from any one of the modules is able to trigger the assertion of the combined signal, the approach minimizing consumption of energy particularly during quiescent and inactive states, the approach permitting very high reliability even in the face of possible degradation of particular circuit elements. It would be desirable if particular categories of possible degradation could be detected early on, permitting remediation at such time as overall circuit function has not been interfered with.

SUMMARY OF THE INVENTION

A method and an exemplary circuit is disclosed for highly reliable signal propagation across a galvanic isolation barrier. A circuit built according to the method described can be characterized as having very low quiescent power consumption and quick signal propagation, while guaranteeing that the galvanic isolation circuits are fully functional. This is achieved by having two separate channels, and relying on one channel to provide the actual signal while the other channel is being tested. This is different from the prior art implementations that rely on reduction of the probability of a fault, and where two (or more) redundant channels are used, with signal propagating when at least a single channel is activated.

Briefly, a system is used with a plurality of modules, each module requiring galvanic isolation from the other modules. Galvanic isolators are employed, each having an input and an output, the output galvanically isolated from the input, the output responsive to the input according to a response characteristic of the isolator. Each module has, a respective first isolator and a respective second isolator. The input of each respective first isolator and each respective second isolator for each module is disposed controllably to receive an activation signal from the module indicative of a module fault to be annunciated or to receive a test signal from the module, the test signal being smaller than the activation signal. The outputs of the respective first isolators are aggregated to a first node and the outputs of the respective second isolators are aggregated to a second node. A selection circuit selects from the first node and the second node, yielding a fault signal output when the selected node satisfies a predetermined condition. An analog-to-digital converter is coupled with each of the nodes, the analog-to-digital converter disposed to sense an output from one of the isolators indicative of its response characteristic in the event of a test signal being applied to the isolator.

DESCRIPTION OF THE DRAWING

The current invention is described with the aid of a drawing in several figures, of which:

FIG. 1 depicts a selection of galvanic signal isolators and their operations;

FIG. 2 illustrates prior art with wired AND connections of multiple signals;

FIG. 3 demonstrates prior art with wired OR connections of multiple signals;

FIG. 4 outlines prior art with wired OR connections of multiple signals and with two redundant channels;

FIG. 7 shows the system with a battery.

DETAILED DESCRIPTION

Figure 5:
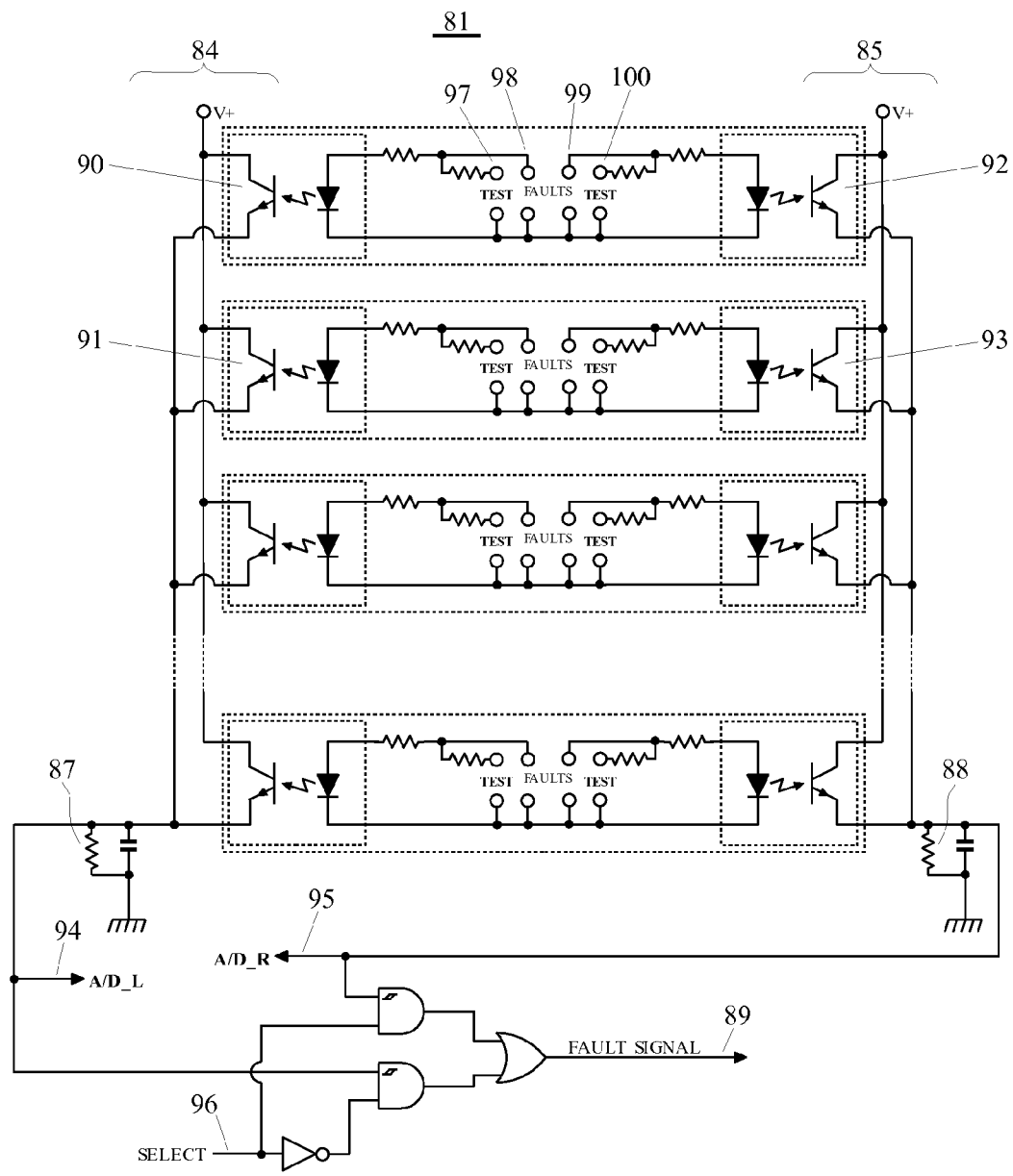
FIG. 5 reveals one exemplary embodiment of the current invention.

Turning now to FIG. 5, what is seen is a circuit 81 exemplifying the current invention. It accommodates an arbitrary number of opto-isolator faults, by either providing normal functionality, or by indicating the possible fault to the system controller. With this circuit 81, at any time, there is at least a single channel that is able to propagate the signal from every module to the common fault signal 89. The particular channel is selected with a select line 96.

The function of the circuit 81 in the absence of circuit faults will be described firstly.

Just before the select line 96 changes state, each channel (to the left and to the right in FIG. 5) is equally able to propagate the aggregated fault signal to line 89 from the various modules being monitored.

The logic elements (inverter, AND gates, OR gate) associated with select line 96 are chosen to have delays that are very low, and in particular much faster that the propagation time through the opto-isolators. For this reason the selection of the active channel (by select line 96) can be considered instantaneous and thus does not present a risk of obstructing the fault signal output 89.

After the select line 96 changes state, one of the channels is therefore designated to be active (providing the propagation of the fault signal), and the other channel becomes inactive. The output of the inactive channel is disconnected from the fault signal output. Saying this in a different way, either the right-hand channel (in FIG. 5) is active and the left-hand channel is not, or the left-hand channel is active and the right-hand channel is not. The left-hand channel includes the paralleled transistors at 84, and the right-hand channel includes the paralleled transistors at 85.

At any given instant, one of the two channels is thus inactive. Whichever channel is inactive can now be tested in order to verify operations of the opto-isolators. This testing will now be described.

A test current that is smaller than the normal activation current is passed through the LED of one and only one opto-isolator. For example suppose that the state of the select line 96 is such that the right-hand channel (including transistors 85) is active. This means that the left-hand channel (including transistors 84) is inactive so far as fault annunciation is concerned. The normal activation current would have been supplied at 98, turning on the associated LED at its normal level of illumination. During this test step, however, voltage is applied not at 98 but at 97. This provides a test current to the LED, smaller than the normal activation current. The LED is illuminated at a smaller level of illumination, thus providing less turn-on stimulation to transistor 90. The voltage-divider result with fixed resistor 87 is different in test mode than in normal activation mode. An analog-to-digital (A/D) converter at 94 permits a close analysis of the voltage-divider result.

The finely resolved measurement at 94 is in contradistinction to the Schmitt-trigger threshold in the AND gate as shown in FIG. 5, a threshold that yields either a logical "0" or logical "1" toward the signal line 89.

Returning to a discussion of the test mode, the resulting current in the output of the optio-isolator being tested produces a particular voltage on the common line at 94 that is connected to all of the opto-isolators 84 in the inactive channel. This particular voltage is measured and converted into a digital value by the A/D (analog-to-digital) converter. The digital value allows calculation of the actual CTR (Current Transfer Ratio) for the opto-isolator that is being tested. Then, a decision can be made as to the ability of the opto-isolator to pass the signal unimpeded, or to declare the opto-isolator faulty.

The above procedure is repeated for every single opto-isolator that is connected in the inactive channel, one at a time. Out-of-band control signals, communicated by means omitted for clarity in FIG. 5, coordinate the test behavior of the modules. In the simplest case, no two modules will be sending the test current at the same time.

The result of the test will either prove that all opto-isolators in the inactive channel are fully functional, or a fault can be indicated to the system controller.

If all opto-isolators are proven to be fully functional, the inactive channel is returned to the function of propagation of the fault signal, by which we mean that the select control line 96 is made to change state. The last-tested channel becomes active, and the other channel becomes inactive.

Then the opto-isolators that are connected in the inactive channel are tested, with exactly the same procedure as described above.

As a result of the described method, any optio-isolator that becomes faulty will be detected within the time that is less than or at most equal to the complete test cycle time for both channels.

The assumption in all of this is that there is some circuit failure mode (or some constellation of circuit failure modes) that arises over time with some probability as a function of time. In the case of opto-isolators one of the circuit failure modes is a degradation of the CTR (current transfer ratio).

In the case of a different type of isolator the characteristic that degrades might be some other transfer ratio or transfer function that relates the output to the input.

The failure mode (or constellation of failure modes) is capable of being remedied through component or module replacement if only the human operator is made aware of the need for such replacement. The circuit is designed so that any one such failure can be survived in the sense that the collection of aggregated module failure reports is able to proceed unimpeded despite any one such circuit failure. And the regime of test cycles and remediation steps by a human operator is established so that it is very likely that any needed remediation would have been carried out long before the accumulated risk of a second such circuit failure had risen to a worrisome level.

Stating this differently, while the circuit 81 would fail at its purpose of aggregating module fault reports if the number of circuit faults occurring had risen to two, the regime of test cycles and remediation steps is such that very likely the remediation of the first circuit fault would have been carried out long before the second circuit fault would likely have arisen.

The reader will appreciate that the benefits of circuit 81 do come at some cost. Circuit 81 has two A/D converters (or one A/D converter with a suitable multiplexer). It has a greatly increased component count as compared with circuits 41 or 51 and even as compared with circuit 61 its component count is greater. What's more, circuit 81 imposes an out-of-band signaling cost (both in hardware and in communications and control bandwidth) to coordinate the test behavior of the various modules being monitored. It will be recalled, however, that it is often desired to have an emergency deactivating signal that prevents system deterioration, possible destruction and bodily harm to the users. For example if charging current is being applied to a battery system, it may be desired to cut off the charging current abruptly in the event of any of certain detected conditions within the battery system. If a discharge current is being passed from the battery system to a load (for example in an electric or hybrid car) it may be desired to cut off the discharge current abruptly in the event of any of certain other detected conditions.

The A/D converters may have only a few bits of resolution or may have many bits of resolution. The main point is that each A/D converter is able to resolve any of several signal levels that differ from the threshold level for the AND gates. The resolution of the A/D converters is selected so as to permit some desired level of early warning that the transfer characteristic of the isolator is degrading and may justify replacement thereof, well enough in advance of any likely failure of a second isolator.

Figure 6A:
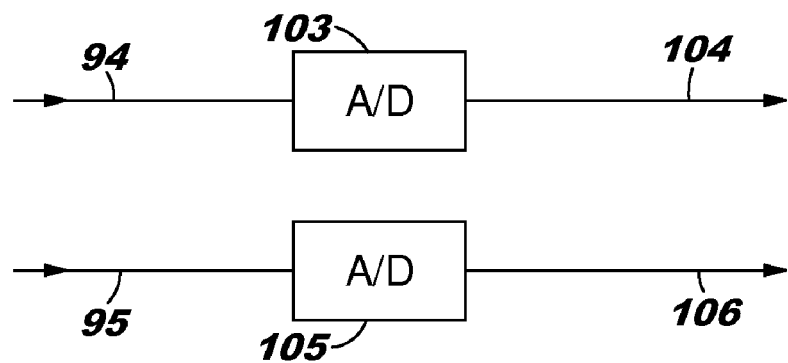
FIGS. 6a and 6b show two ways to connect multiplexers.

FIG. 6*a* shows a first approach for providing the A-to-D converters mentioned above in connection with FIG. 5. It will be recalled that in FIG. 5 there is reference to a connection 94 to an "A/D_L" meaning an A-to-D converter associated with the left-hand circuitry of FIG. 5. Likewise it will be recalled that in FIG. 5 there is reference to a connection 95 to an "A/D_R" meaning an A-to-D converter associated with the right-hand circuitry of FIG. 5. FIG. 6*a* shows one arrangement of the A-to-D converters, namely a first A-to-D converter 103 with an output 104, and a second A-to-D converter 105 with an output 106.

Figure 6B:
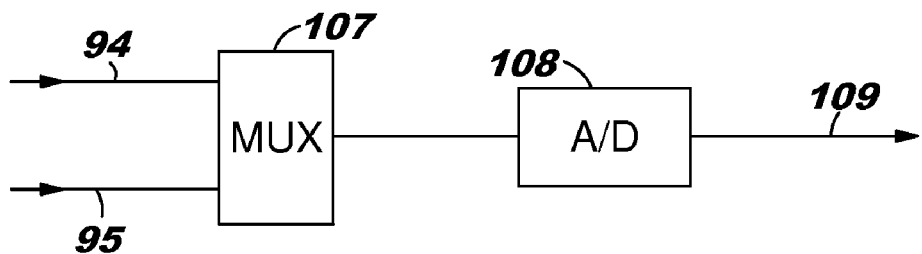

As mentioned above, however, a second approach is to use just one A-to-D converter with a suitable multiplexer. Such an approach is shown in FIG. 6*b*. In the approach of FIG. 6*b*, lines 94 and 95 feed to a multiplexer 107. The output of the multiplexer 107 passes to A-to-D converter 108 with an output 109.

FIG. 7 shows the system in connection with a battery 121 constructed from a series string of modules, each module itself containing series-connected cells 122, 123, 124 etc. Each module has a sensing/testing circuit 132, 133, 134 which connects to lines 97, 98, 99, 100 (for example) from the module containing cells 122. Such outputs connect to the connection points such as 97, 98, 99, 100 in FIG. 5.

A person skilled in the art will easily recognize that the same considerations as described for the opto-isolators can fully apply to other types of isolators such as galvanic isolators based on transformers, with obvious adjustments that are particular to the difference in the operating principles of these devices. The general notion is that some degradation or constellation of degradations will be presented as an aging or time-dependent risk for the isolator, and by means of the invention such degradation may be detected early on for a particular isolator, before a degradation of a second such isolator is likely to have occurred, and in good time to permit replacement of the particular isolator individually or as part of a field-replaceable unit (FRU).

The invention has been described with respect to a particular circuit 81 having a particular topology and an associated sequence of testing steps, but the reader will appreciate that the teachings of the invention offer themselves for use with any of a range of obvious variants of the portrayed topology, each variant making use of a respective sequence of testing steps, without departing in any way from the invention and offering the benefits described in reliability and in efficacy in the aggregation of the individual module annunciations. Any and all such obvious variants and improvements are intended to be encompassed within the claims which follow.

The invention claimed is:

1. A system for use with a plurality of modules, each module requiring galvanic isolation from the other modules, and for use with galvanic isolators each having an input and an output, the output galvanically isolated from the input, the output responsive to the input according to a response characteristic of the isolator, the system comprising:

each module having a respective first isolator and a respective second isolator;

the input of the respective first isolator for each module disposed controllably to receive a first activation signal from the module indicative of a module fault to be annunciated or to receive a first test signal from the module, the first test signal being smaller at the input of the respective first isolator than the first activation signal;

the input of the respective second isolator for each module disposed controllably to receive a second activation signal from the module indicative of a module fault to be annunciated or to receive a second test signal from the module, the second test signal being smaller at the input of the respective second isolator than the second activation signal;

the outputs of the respective first isolators aggregated to a first node;

the outputs of the respective second isolators aggregated to a second node;

the system further comprising a selection circuit selecting from the first node and the second node, and yielding a fault signal output when the selected node satisfies a predetermined condition;

the system further comprising a first analog-to-digital converter coupled with the first node, the first analog-to-digital converter disposed to sense an output from one of the first isolators indicative of its response characteristic in the event of a first test signal being applied to the input of the one of the first isolators;

the system further comprising a second analog-to-digital converter coupled with the second node, the second analog-to-digital converter disposed to sense an output from one of the second isolators indicative of its response characteristic in the event of a second test signal being applied to the input of the one of the second isolators.

2. The system of claim 1 wherein the first analog-to-digital converter coupled with the first node and the second analog-to-digital converter coupled with the second node are the same analog-to-digital converter, multiplexed thereto.

3. The system of claim 1 wherein each of the galvanic isolators is an opto-isolator comprising a light-emitting diode connected to the input thereof, and comprising a phototransistor connected to the output thereof, and wherein the response characteristic is a current transfer ratio thereof.

4. The system of claim 3 wherein the aggregation of the outputs of the respective first isolators to the first node comprises a wired OR configuration, and wherein the aggregation of the outputs of the respective second isolators to the second node comprises a wired OR configuration.

5. The system of claim 1 further comprising a battery comprising a series connection of cell modules, each module having the respective first isolator and the respective second isolator;
   each cell module sensing some predetermined fault condition sensed within the cell module and communicated external to the cell module by means of the respective first isolator and the respective second isolator;
   each cell module responding to control signals received from external to the cell module by asserting the test signal at the respective first isolator or at the respective second isolator.

6. A method for use with a system having a plurality of modules, each module requiring galvanic isolation from the other modules, and for use with galvanic isolators each having an input and an output, the output galvanically isolated from the input, the output responsive to the input according to a response characteristic of the isolator, each module having, a respective first isolator and a respective second isolator, the outputs of the respective first isolators aggregated to a first node, the outputs of the respective second isolators aggregated to a second node, the system further comprising a selection circuit selecting from the first node and the second node, and yielding a fault signal output when the selected node satisfies a predetermined condition, each module disposed in the event of a detected module fault to provide an activation signal to at least one of the input of the first respective isolator and the input of the second respective isolator, the method comprising the steps of:
   selecting the second node;
   at a first one of the modules, providing a test signal to the input of the first respective isolator of the first one of the modules, the test signal being smaller at the input of the respective first isolator than the activation signal;
   sensing by means of an analog-to-digital converter the signal at the first node, whereby the response characteristic of the respective first isolator of the first one of the modules is measured.

7. The method of claim 6 further comprising the subsequent steps of:
   at a second one of the modules, providing a test signal to the input of the first respective isolator of the second one of the modules, the test signal being smaller at the input of the respective first isolator than the activation signal;
   sensing by means of an analog-to-digital converter the signal at the first node, whereby the response characteristic of the respective first isolator of the second one of the modules is measured.

8. The method of claim 7 further comprising the subsequent steps of:
   selecting the first node;
   at the first one of the modules, providing a test signal to the input of the second respective isolator of the first one of the modules, the test signal being smaller at the input of the respective second isolator than the activation signal;
   sensing by means of an analog-to-digital converter the signal at the second node, whereby the response characteristic of the respective second isolator of the first one of the modules is measured.

9. The method of claim 8 further comprising the subsequent steps of:
   at the second one of the modules, providing a test signal to the input of the second respective isolator of the second one of the modules, the test signal being smaller at the input of the respective second isolator than the activation signal;
   sensing by means of an analog-to-digital converter the signal at the second node, whereby the response characteristic of the respective second isolator of the second one of the modules is measured.

10. The method of claim 6 further comprising the subsequent steps of:
    at one of the modules, detecting a module fault;
    at the one of the modules, providing the activation signal to the input of the second respective isolator;
    providing the fault signal output from the selection circuit.

11. The method of claim 6 wherein each of the galvanic isolators is an opto-isolator comprising a light-emitting diode connected to the input thereof, and comprising a phototransistor connected to the output thereof, and wherein the response characteristic is a current transfer ratio thereof.

12. The method of claim 11 wherein the aggregation of the outputs of the respective first isolators to the first node comprises a wired OR configuration, and wherein the aggregation of the outputs of the respective second isolators to the second node comprises a wired OR configuration.

* * * * *